(12) United States Patent
Steinhoff et al.

(10) Patent No.: US 6,424,013 B1
(45) Date of Patent: Jul. 23, 2002

(54) BODY-TRIGGERED ESD PROTECTION CIRCUIT

(75) Inventors: Robert Steinhoff, Dallas; Jonathan S. Brodsky, Richardson; Thomas A. Vrotsos, Plano, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/586,637

(22) Filed: Jun. 5, 2000

Related U.S. Application Data
(60) Provisional application No. 60/143,193, filed on Jul. 9, 1999.

(51) Int. Cl.[7] .............................................. H01L 23/62
(52) U.S. Cl. ...................... 257/355; 257/358; 257/359; 257/360
(58) Field of Search ................................. 257/355–365

(56) References Cited

U.S. PATENT DOCUMENTS

| | | | |
|---|---|---|---|
| 5,341,005 A | * | 8/1994 | Canclini |
| 5,508,548 A | * | 4/1996 | Tailliet |
| 5,945,713 A | * | 8/1999 | Voldman |
| 6,043,969 A | * | 3/2000 | Sharpe-Geisler |
| 6,233,130 B1 | * | 5/2001 | Lin |

\* cited by examiner

*Primary Examiner*—Fetsum Abraham
(74) *Attorney, Agent, or Firm*—Robert N. Roundtree; Wade James Brady, III; Frederick J. Telecky, Jr.

(57) ABSTRACT

A protection circuit is designed with an external terminal (300), a reference terminal (126) and a substrate (342). A semiconductor body (338) is formed by an isolation region (332, 340) formed between the substrate and the semiconductor body, thereby enclosing the semiconductor body. A plurality of transistors is formed in the semiconductor body. Each transistor has a respective control terminal (354) connected to a common control terminal (321) and a respective current path connected between the external terminal and the reference terminal. A capacitor (314) is connected between the semiconductor body and the external terminal. A resistor (318) is connected between the semiconductor body and the reference terminal.

17 Claims, 5 Drawing Sheets

BODY-TRIGGERED ESD PROTECTION CIRCUIT

CLAIM TO PRIORITY OF PROVISIONAL APPLICATION

This application claims priority under 35 U.S.C. § 119(e)(1) of provisional application number 60/143,193, filed Jul. 9, 1999.

FIELD OF THE INVENTION

This invention relates to an integrated circuit and more particularly to an integrated circuit with a body triggered electrostatic discharge protection circuit.

BACKGROUND OF THE INVENTION

Present complementary metal oxide semiconductor (CMOS) and bipolar-CMOS (BiCMOS) circuits employ electrostatic discharge protection (ESD) circuits to protect against electrostatic discharge due to ordinary human and machine handling. This electrostatic discharge occurs when the semiconductor circuit contacts an object that is charged to a substantially different electrostatic potential of typically several thousand volts. The contact produces a short-duration, high-current transient in the semiconductor circuit. This high current transient may damage the semiconductor circuit through joule heating. Furthermore, high voltage developed across internal components of the semiconductor circuit may damage MOS transistor gate oxide.

Sensitivity of the semiconductor circuit is determined by various test methods. A typical circuit used to determine sensitivity of the semiconductor circuit to human handling includes a capacitor and resistor emulate a human body resistor-capacitor (RC) time constant. The capacitor is preferably 100 pF, and the resistor is preferably 1500 Ω, thereby providing a 150-nanosecond time constant. A semiconductor device or device under test is connected to the test circuit at a predetermined external terminal for a selected test pin combination. In operation, the capacitor is initially charged to a predetermined stress voltage and discharged through the resistor and the semiconductor device. A post stress current-voltage measurement determines whether the semiconductor device is damaged. Although this test effectively emulates electrostatic discharge from a human body, it fails to comprehend other common forms of electrostatic discharge.

A charged-device ESD test is another common test method for testing semiconductor device sensitivity. This method is typically used to determine sensitivity of the semiconductor circuit to ESD under automated manufacturing conditions. The test circuit includes a stress voltage supply connected in series with a current limiting resistor. The semiconductor device forms a capacitor above a ground plane that is typically 1–2 pF. A low impedance conductor forms a discharge path having an RC time constant typically two orders of magnitude less than a human body model ESD tester. In operation, the semiconductor device is initially charged with respect to the ground plane to a predetermined stress voltage. The semiconductor device is then discharged at a selected terminal through the low impedance conductor. This connection produces a high-voltage, high-current discharge in which a magnitude of the initial voltage across the semiconductor device approaches that of the initial stress voltage.

Referring to FIG. 1, there is an ESD protection circuit of the prior art including a large multiple finger metal oxide semiconductor (MOS) transistor network (110–118) to conduct the ESD current. This multiple finger MOS transistor is constructed of similar parallel MOS transistors or fingers to withstand high levels of ESD stress current. Under ideal conditions, these MOS transistors generally offer greater ESD protection with increasing transistor width. The common gate terminal 122 of these MOS transistors is grounded by resistor 122 so that they remain off during normal circuit operation.

Referring now to FIG. 2, there is an ideal current-voltage (IV) characteristic of an individual MOS transistor. The IV characteristic shows that negligible drain-source current ($I_{DS}$) flows through the MOS transistor while drain-source voltage ($V_{DS}$) is less than the avalanche voltage ($V_A$). When voltage across the MOS transistor exceeds $V_A$ as during an ESD pulse, the drain-source voltage $V_{DS}$ decreases to snap back voltage $V_{SB}$. This snap back is similar to a transition from the open-emitter collector-base breakdown voltage ($BV_{CBO}$) to the open-base collector-emitter breakdown voltage ($BV_{CEO}$) of a bipolar transistor. Any subsequent increase in $V_{DS}$ significantly increases $I_{DS}$. A common problem with these ESD protection circuits of the prior art, however, arises due to slight variations of the IV characteristic with each MOS transistor due to process and layout variations. When one of the MOS transistors, for example transistor 110, begins conducting prior to the other transistors (112–118), it snaps back to region 200. Transistors 112–118 have a common $V_{DS}$ with transistor 110 and return to region 202. Transistors 112–118, therefore, conduct negligible ESD current. Transistor 110, however, conducts virtually all the ESD current. This current hogging reduces the effective width of the protection circuit to the width of transistor 110, thereby reducing the corresponding failure threshold of the semiconductor device.

Alternative protection circuit designs of the prior art have attempted to overcome this problem by increasing the value of resistor 120, thereby permitting the voltage at common gate electrode 122 to increase by capacitive coupling with application of an ESD pulse. This method of triggering the MOS device, however, requires time to form of an MOS inversion layer and begin avalanche conduction in the pinch-off region of the channel prior to conduction. Other circuit designs have included individual resistors (not shown) in series with each corresponding transistor 110–118. These individual resistors decrease the slope of the curve at region 206 so that the voltage at region 204 exceeds avalanche voltage $V_A$. This advantageously prevents a premature transition of any transistor into second breakdown and ensures that all parallel transistors will eventually turn on. This method, however, requires an even greater time for each transistor to turn on and may result in premature failure of individual transistors before all transistors begin conduction. Thus, none of the protection circuit methods of the prior art offer a satisfactory turn on time required for fast ESD pulses such as the charged-device test pulse.

SUMMARY OF THE INVENTION

These problems are resolved by a protection circuit with an external terminal, a reference terminal and a substrate. A semiconductor body is formed by an isolation region formed between the substrate and the semiconductor body, thereby enclosing the semiconductor body. A plurality of transistors is formed in the semiconductor body. Each transistor has a respective control terminal connected to a common control terminal and a respective current path connected between the external terminal and the reference terminal. A capacitor is connected between the semiconductor body and the external terminal. A resistor is connected between the semiconductor body and the reference terminal.

The present invention provides fast activation of an ESD protection circuit by capacitively coupling a fraction of an ESD stress voltage to the semiconductor body. Parallel protection transistors are uniformly activated and resistance is minimized.

BRIEF DESCRIPTION OF THE DRAWINGS

A more complete understanding of the invention may be gained by reading the subsequent detailed description with reference to the drawings wherein.

DETAILED DESCRIPTION OF THE PREFERRED EMBODIMENTS

Figure 3A:
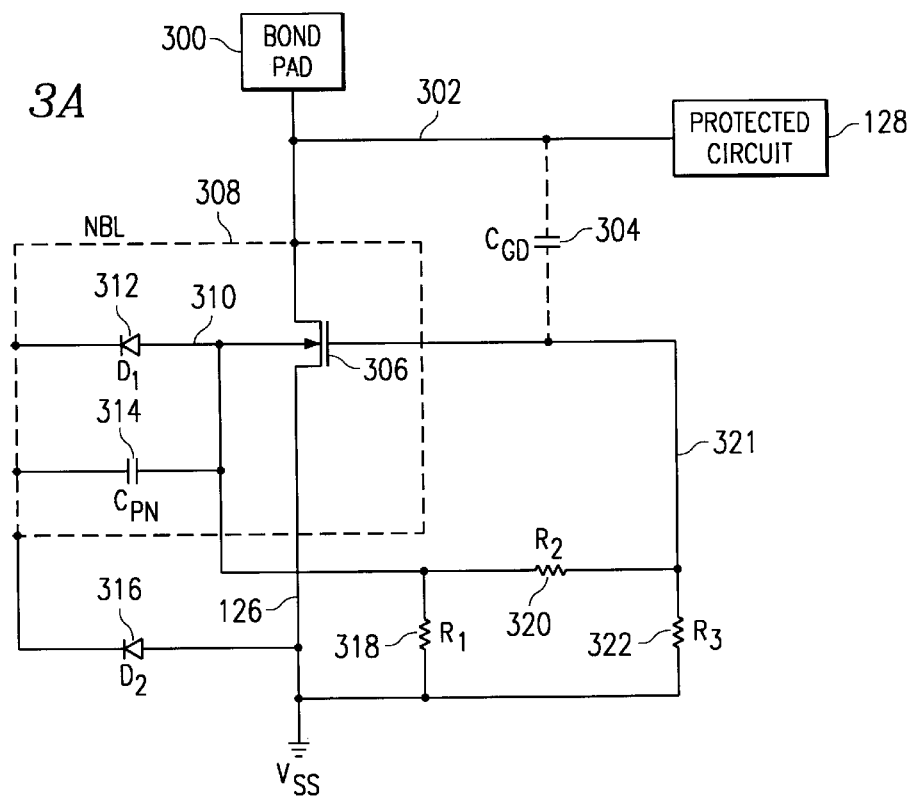
FIG. 3A is a schematic diagram of an embodiment of a protection circuit of the present invention.

The circuit of FIG. 3A, is a schematic diagram of an embodiment of a protection circuit of the present invention. The circuit includes a metal-oxide-semiconductor (MOS) transistor 306 connected between an external terminal or bond pad 300 and a reference terminal $V_{SS}$ 126. The circuit is connected via lead 302 to an internal or protected circuit 128. The MOS transistor 306 is formed within a semiconductor body enclosed by N-buried layer (NBL) 308 as indicated by the dashed line. The NBL is also connected to the external terminal at lead 302. A parasitic diode $D_1$ 312 and parasitic junction capacitor $C_{PN}$ 314 are connected in parallel between the NBL 308 and the semiconductor body. A parasitic capacitor $C_{GD}$ 304 is connected between the control gate and drain terminals of MOS transistor 306. A resistor network including resistors $R_1$, $R_2$ and $R_3$ is connected between the semiconductor body or MOS bulk terminal, the MOS gate terminal and the reference terminal 126. Diode $D_2$ 316 is formed between the reference terminal 126 and the NBL.

Figure 3B:
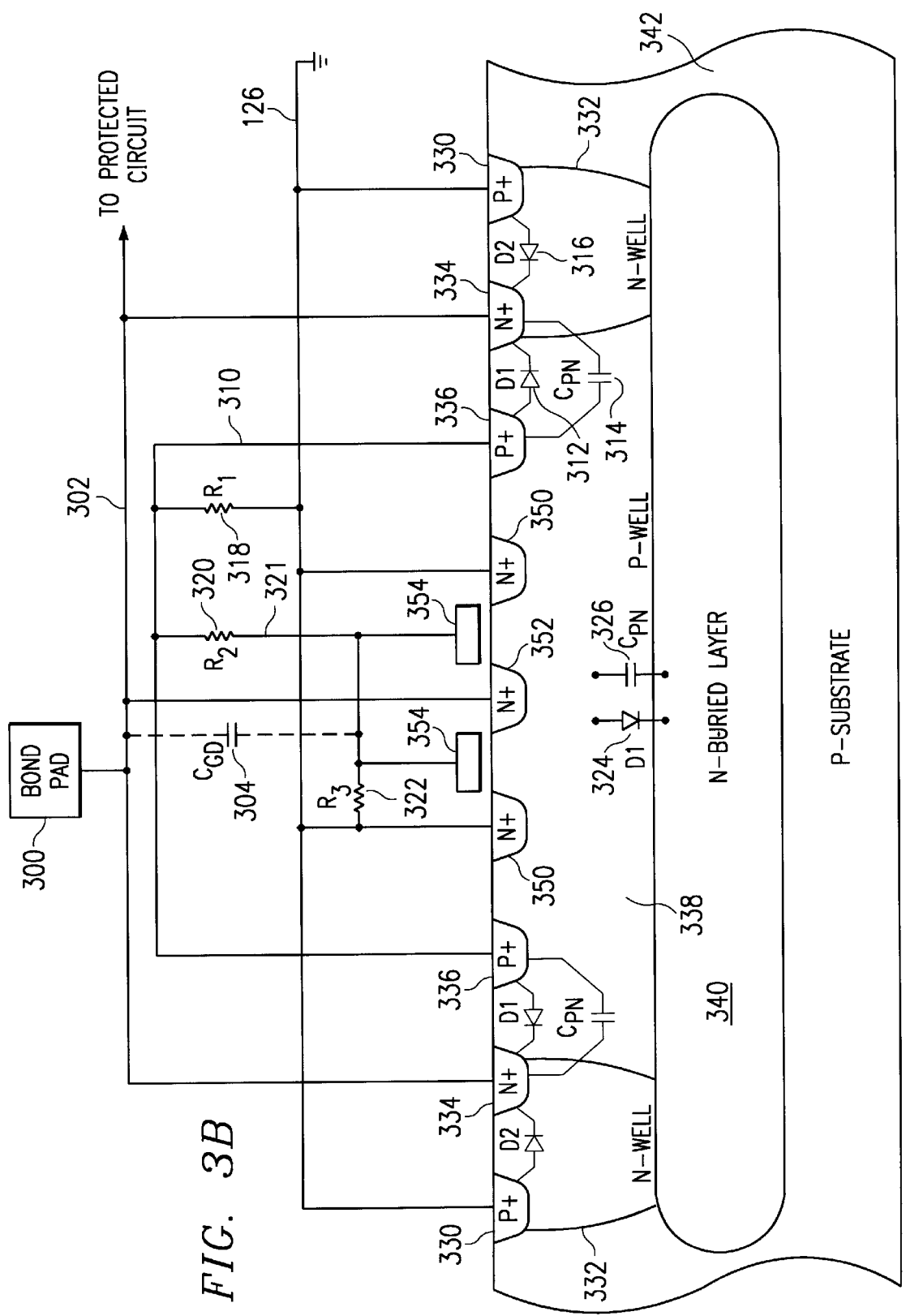
FIG. 3B is a cross-sectional view of the protection circuit of FIG. 3A.

Referring now to FIG. 3B, there is a cross-sectional view of the protection circuit of FIG. 3A that will be used to explain the physical implementation of the present invention in detail. Reference numerals are consistent with other figures for like elements. The embodiment of FIG. 3B includes two transistors connected in parallel to form MOS transistor 306 of FIG. 3A. The two transistors include common drain region 352, source regions 350 and gate regions 354. These and other doped regions of FIG. 3B are preferably elongate and parallel regions extending into the page. Parasitic capacitance $C_{GD}$ 304 is shown between the gate terminal at lead 321 and drain terminal at lead 302 but is physically located at the overlap of gate regions 354 and drain region 352 as is well known in the art. The semiconductor body 338 or bulk terminal of MOS transistor 306 is a P-well region formed within the P-substrate 342. The semiconductor body is isolated from the P-substrate on all sides by N-well regions 332. The semiconductor body is further isolated from the P-substrate by the underlying NBL region 340. This isolation region including N-well regions 332 and NBL region 340, therefore, includes separate components for parasitic diode $D_1$ and parasitic capacitor $C_{PN}$. Parasitic diode $D_1$ includes diode component 312 at the junction of the lightly doped semiconductor body 338 and the lightly doped N-well 332 as well as component 324 at the junction of the semiconductor body 338 and the heavily doped NBL region 340. Parasitic junction capacitance components $C_{PN}$ 314 and 326 correspond to diode components 312 and 324, respectively. The NBL region 340 is electrically connected to the bond pad 300 through N-well regions 332, heavily doped N+regions 334 and lead 302. The semiconductor body 338 is electrically connected to lead 310 by heavily doped P+regions 336. The semiconductor body 338 is further connected to reference terminal 126 or $V_{SS}$ by resistor $R_1$. Resistor $R_2$ connects the common gate lead 321 to lead 310. Resistor $R_3$ connects the common gate lead to reference terminal 126. Resistors $R_1$ and $R_3$ are preferably 20 kΩ each, and resistor $R_2$ is preferably 1 kΩ.

Figure 5:
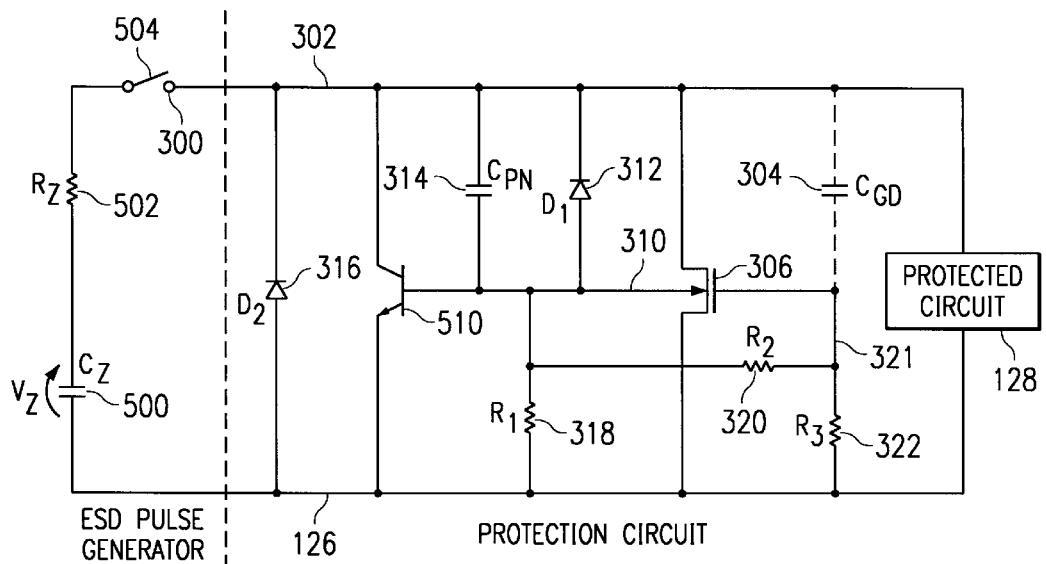
FIG. 5 is a schematic diagram of an equivalent circuit of the protection circuit of FIG. 3A.

Turning now to FIG. 5, there is a schematic diagram of an equivalent circuit of the protection circuit of FIG. 3A that will be used to explain operation of the circuit of FIG. 3A in detail. The circuit includes an ESD pulse generator that is external to the semiconductor device. The ESD pulse generator is represented by switch 504, resistor $R_Z$ and capacitor $C_Z$ charged to an initial voltage $V_Z$. This ESD pulse generator may be an ESD test circuit or equivalent components such as capacitance of the semiconductor device with respect to a ground plane and resistance of the discharge path. The protection circuit includes MOS transistor 306 and corresponding parasitic bipolar transistor 510 as well as other previously described components of the present invention. The collector, emitter and base regions of transistor 510 correspond to drain 352, source 350 and semiconductor body 338 regions (FIG. 3B) of MOS transistor 306 (FIG. 3A).

Figure 1:
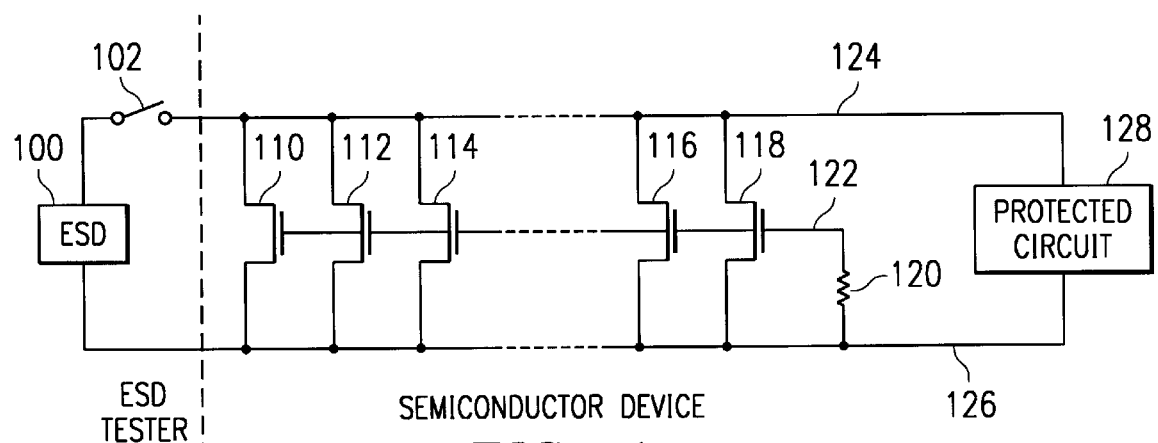
FIG. 1 is a schematic diagram of a protection circuit of the prior art.
Figure 2:
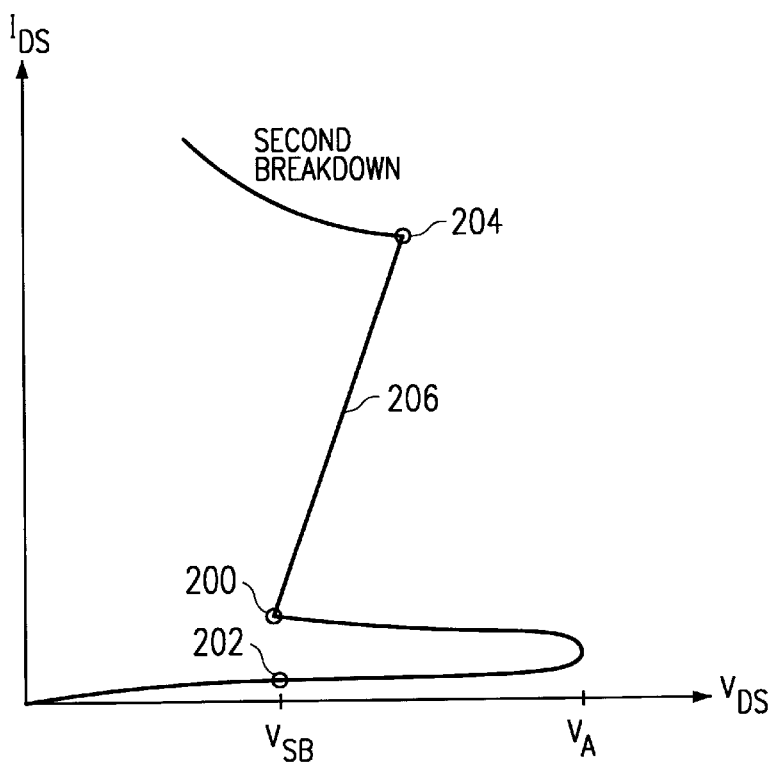
FIG. 2 is a current-voltage curve of a MOS transistor of the prior art.

In operation, the pulse generator produces an ESD pulse when switch 504 is closed, thereby discharging capacitor $C_Z$ into the protection circuit through the external terminal 300 along lead 302. For a negative voltage $V_Z$ with respect to reference terminal 126, diode $D_2$ 316 is forward biased and conducts discharge current from capacitor $C_Z$, thereby protecting the protected circuit 128. For positive voltage $V_Z$, however, diodes $D_1$ and $D_2$ are reverse biased and conduct negligible current. Bulk terminal 310 and gate terminal 321 are initially forced to zero volts with respect to reference terminal 126 by resistors $R_1$ and $R_3$, respectively. The ESD pulse increases voltage at lead 302, thereby reverse biasing the collector-base junction of transistor 510. The parasitic junction capacitor $C_{PN}$ 314 couples a fraction of the voltage increase at lead 302 to the semiconductor body at lead 310. The ESD pulse couples a smaller fraction of the voltage increase at lead 302 to the gate terminal at lead 321 through the relatively smaller overlap capacitor $C_{GD}$ due to the small ratio of capacitor $C_{GD}$ to the gate capacitance of MOS transistor 306. Resistor $R_2$ forms a voltage divider with resistor $R_3$ to couple a fraction of the voltage at lead 310 to gate lead 321. The voltage increase at lead 321 begins to form an inversion layer in the channel of MOS transistor 306. The voltage increase at lead 310, however, serves to forward bias the base-emitter junction of bipolar transistor 510 before the inversion layer is formed. The forward biased base-emitter junction produces a significant increase in electron current and corresponding minority carriers in the semiconductor body at lead 310. This increase in minority carriers further increases the reverse bias of the collector-base junction of transistor 510. The increased reverse bias exceeds voltage $V_A$ (FIG. 2), and the collector-emitter voltage across transistor 510 snaps back to an operating point along curve 206 through region 200. The values of resistors $R_1$ and $R_3$ are selected so that this snap back condition, otherwise known as the open base collector emitter breakdown voltage $VB_{CEO}$, is sustained during the high current discharge of the ESD pulse. When capacitor $C_Z$ is sufficiently discharged, the voltage at lead 302 decreases and the operating point of transistor 510 returns to the origin (FIG. 2) through region 200. Resistors of $R_1$ and $R_3$ (FIG. 5) discharge the semiconductor body at lead 312 and gate lead 321, respectively, to the reference voltage, thereby returning the protection circuit to an off state for normal circuit operation.

Operation of this circuit is highly advantageous in protecting the protected circuit 128 from high voltage transients at lead 302 during an ESD pulse. Rapid activation of the parasitic bipolar transistor 510 of MOS transistor 306 quickly shunts ESD current to reference terminal 126. Moreover, the uniform coupling of voltage from the NBL region 340 to the semiconductor body 338 through parasitic junction capacitor $C_{PN}$ 326 (FIG. 3B) provides uniform activation for many parallel transistors that may form MOS transistor 306. This uniform coupling simultaneously turns on all parallel transistors and prevents current hogging as in protection circuits of the prior art.

Figure 4:
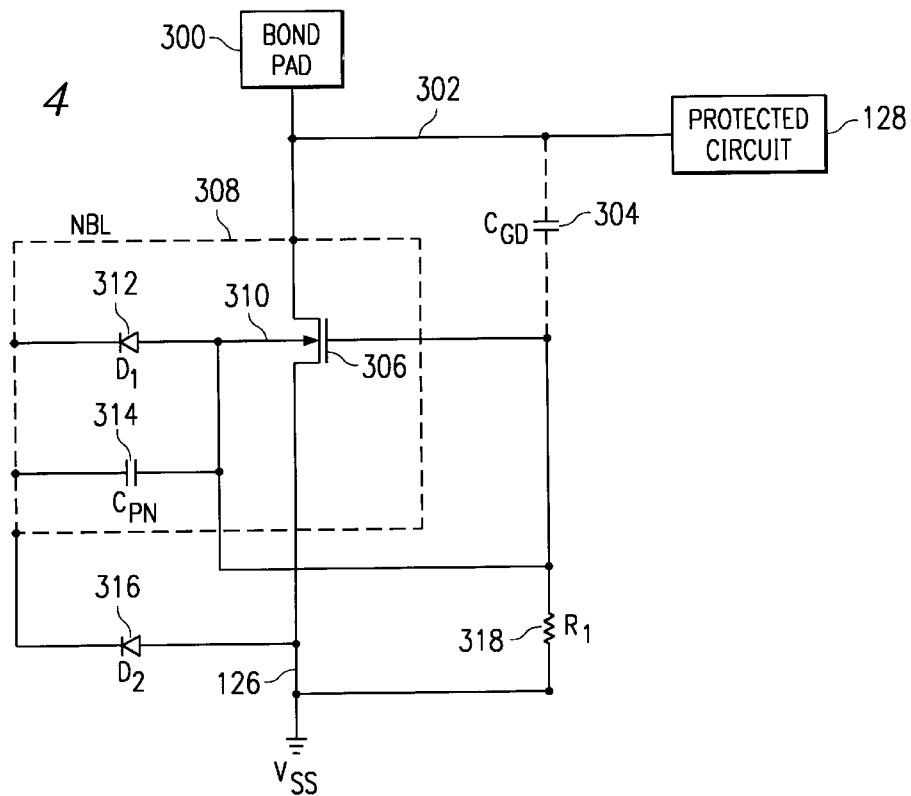
FIG. 4 is a schematic diagram of another embodiment of a protection circuit of the present invention.

Turning now to the circuit of FIG. 4, there is a schematic diagram of another embodiment of a protection circuit of the present invention. The circuit includes all the components of the circuit of FIG. 3A except for resistors $R_2$ and $R_3$. Resistor $R_1$ connects a common semiconductor body and MOS transistor gate lead 310 to reference terminal 126. Resistor $R_1$ is preferably 10 kΩ. Operation of the protection circuit is the same as previously described with respect to FIG. 5 except that the semiconductor body and the MOS gate terminal are held at the same voltage with respect to reference terminal 126. This embodiment of the present invention simplifies design and reduces layout area of the protection circuit.

Figure 6A:
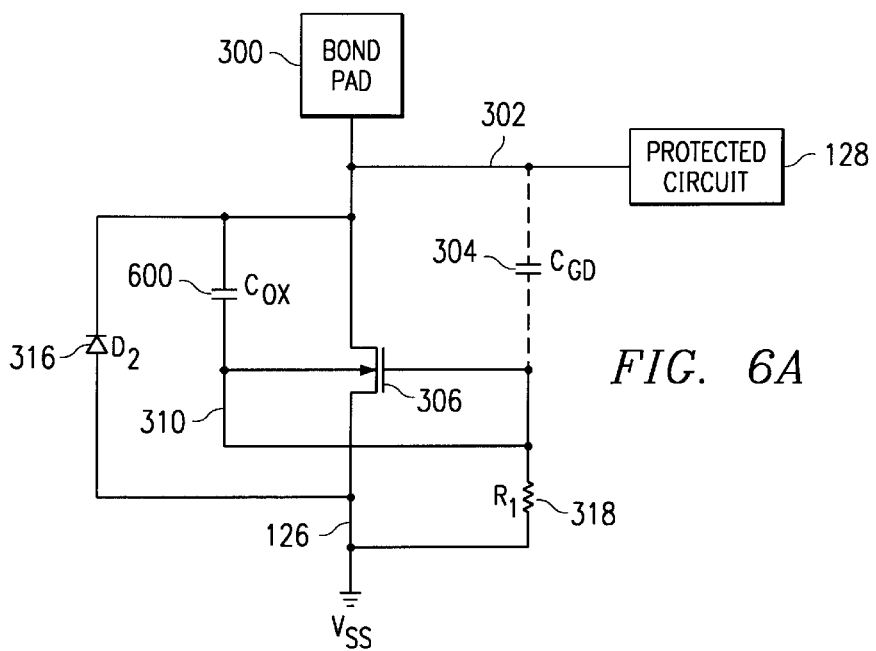
FIG. 6A is a schematic diagram of yet another embodiment of a protection circuit of the present invention.
Figure 6B:
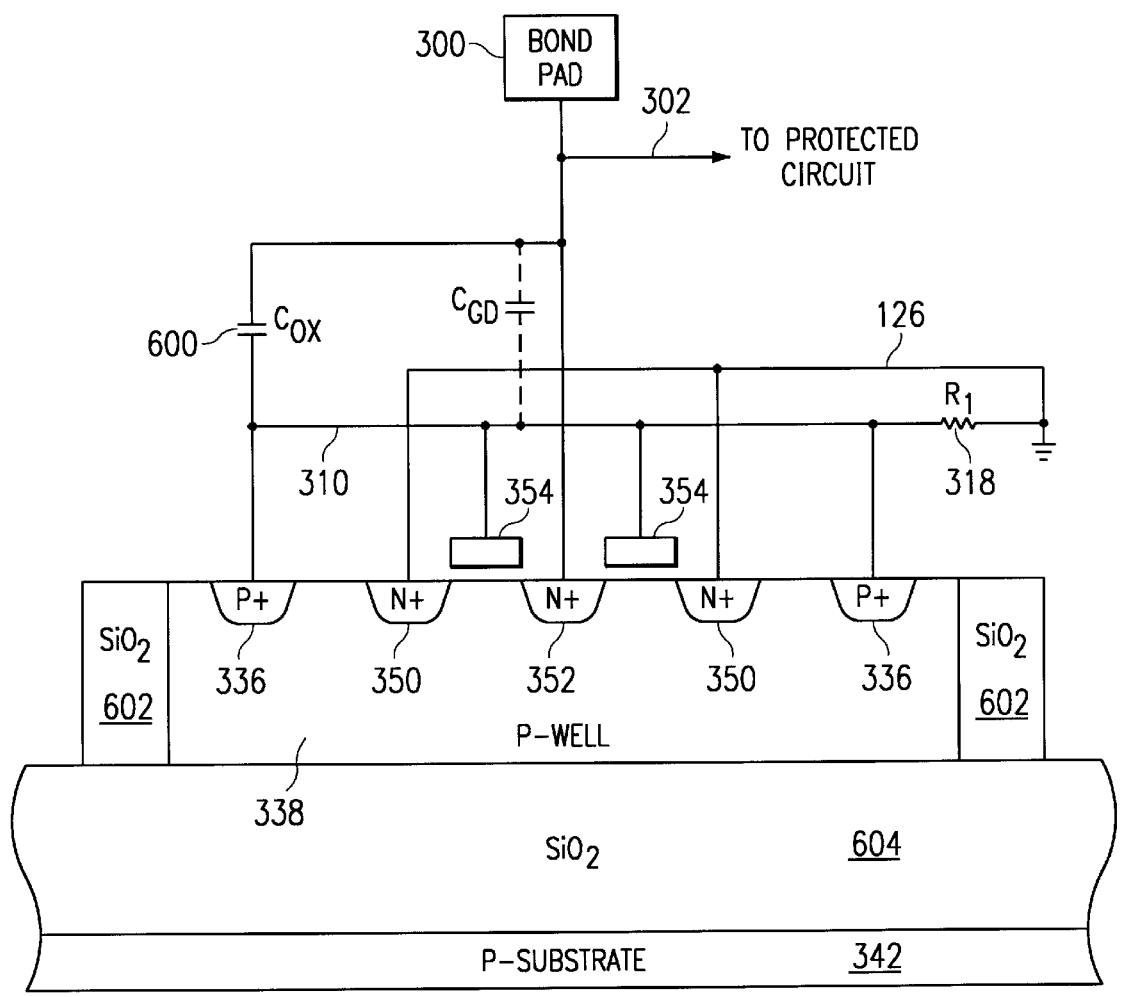
FIG. 6B is a cross-sectional view of the protection circuit of FIG. 6A.

Referring now to FIG. 6A, there is a schematic diagram of yet another embodiment of a protection circuit of the present invention. The circuit of FIG. 6A will be explained in detail with reference to the corresponding cross section of FIG. 6B. The circuit includes MOS transistor 306 formed on a semiconductor body 338 as in previously described embodiments. The semiconductor body, however, is formed using a silicon-on-insulator (SOI) process. The semiconductor body 338 is isolated from P-substrate 342 by an underlying silicon dioxide layer 604 and by silicon dioxide sidewalls 602. The semiconductor body 338 is electrically connected to the common gate lead 310 by heavily doped P+regions 336. Diode $D_2$ is preferably formed external to the semiconductor body 338. Capacitor $C_{OX}$ 600 is a thin oxide capacitor preferably formed from an MOS transistor having a gate terminal connected to lead 302 and a common source and drain terminal connected to lead 310. Capacitor $C_{OX}$ 600 may be formed either within or external to semiconductor body 338.

Operation of the embodiment of FIG. 6A is similar to the previously described operation of the circuit of FIG. 3A. Resistor RI is preferably 10 kΩ and holds the voltage of the semiconductor body 338 at ground during normal circuit operation. During a positive ESD pulse, capacitor $C_{OX}$ couples a sufficient fraction of the voltage transient at lead 302 to the semiconductor body 338 to activate the parasitic bipolar transistor corresponding to MOS transistor 306. The parasitic bipolar transistor snaps back and shunts the ESD current to the reference terminal as previously described.

This embodiment of the present invention is highly advantageous in providing rapid bipolar activation of the protection circuit for SOI processes, silicon-on-sapphire (SOS) processes, or other dielectric isolation processes. Operating speed is an important advantage of the present invention under charged device ESD stress. Circuits of the prior art often require significant charge distribution associated with switching circuits to translate from a nonconducting state to a conducting state. This charge distribution, for example, to form an inversion layer requires significant time compared to the ESD pulse width. Many circuits of the prior art, therefore, are unable to quickly respond to extremely fast sub-nanosecond transients. The capacitive coupling of the body-triggered MOS protection circuit of the present invention, however, has very little resistance or inductance. Furthermore, no switching is required for operation during an ESD event. Thus, the protection circuit of the present invention is highly advantageous under extremely fast transients.

Although the invention has been described in detail with reference to its preferred embodiments, it is to be understood that this description is by way of example only and is not to be construed in a limiting sense. For example, the NBL isolation region 308 and the oxide isolation region 602 need not completely enclose the semiconductor body. Openings in the isolation sidewall may be used advantageously to form resistor $R_1$ from the substrate resistance. In other embodiments, resistors such as resistor $R_1$ may be formed from polycrystalline or crystalline doped regions. Furthermore, the inventive concept of the present invention may be advantageously extended to many parallel transistors in a semiconductor body without current hogging. Moreover, in another alternative embodiment, the parallel transistors may be lateral bipolar transistors without MOS transistors. The common control terminal of these bipolar transistors is the semiconductor body.

It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A structure, comprising:
   an external terminal;
   a reference terminal;
   a substrate;
   a first lightly doped region having a first conductivity type formed at a face of the substrate;
   an isolation region formed in the substrate and enclosing the first lightly doped region;
   a first heavily doped region having a second conductivity type formed at least partially within the first lightly doped region, the first heavily doped region coupled to the external terminal;
   a second heavily doped region having the second conductivity type spaced apart from the first heavily doped region and formed at least partially within the first lightly doped region, the second heavily doped region coupled to the reference terminal;
   a third heavily doped region having the first conductivity type formed at least partially within the first lightly doped region; and a first resistor coupled between the reference terminal and the third heavily doped region.

2. A structure as in claim 1, wherein the isolation region comprises:
   a second lightly doped region having the second conductivity type, the second lightly doped region formed around the first lightly doped region and coupled to the external terminal; and
   a fourth heavily doped region having the second conductivity type, the fourth heavily doped region formed under the first lightly doped region and coupled to the second lightly doped region.

3. A structure as in claim 2, wherein the isolation region comprises a junction capacitance arranged to couple a fraction of a voltage change at the external terminal to the first lightly doped region.

4. A structure as in claim 2, further comprising a fourth heavily doped region having the first conductivity type formed proximate the second lightly doped region, the fourth heavily doped region coupled to the reference terminal.

5. A structure as in claim 1, wherein the isolation region comprises an insulator, the structure further comprising a capacitor coupled between the external terminal and the third heavily doped region.

6. A structure as in claim 1, wherein the first heavily doped region is a drain region of an MOS transistor, the second heavily doped region is a source region of the MOS transistor, and wherein a channel region is formed by the spaced apart region.

7. A structure as in claim 6, wherein each of the first and second heavily doped regions comprise a plurality of separate elongate heavily doped regions, the separate elongate regions spaced apart thereby forming alternate source and drain regions of the MOS transistor, and wherein the spaced apart region comprises a plurality of spaced apart regions, the MOS transistor further comprising a plurality of polycrystalline silicon gate regions overlying the respective plurality of spaced apart regions.

8. A structure as in claim 7, further comprising:
   a second resistor coupled between the polycrystalline silicon gate regions and the first lightly doped region.

9. A structure as in claim 1, wherein the first heavily doped region is a collector region of a bipolar transistor, the second heavily doped region is an emitter region of the bipolar transistor, and wherein a base region is formed by the spaced apart region.

10. A structure as in claim 1, wherein the first resistor comprises polycrystalline silicon.

11. A structure as in claim 1, wherein the first resistor comprises a part of the first lightly doped region.

12. A protection circuit, comprising:
   an external terminal;
   a reference terminal;
   a substrate;
   a semiconductor body;
   an isolation region formed between the substrate and the semiconductor body, thereby enclosing the semiconductor body;
   a plurality of transistors formed in the semiconductor body, each transistor having a respective control terminal coupled to a common control terminal, each transistor having a respective current path coupled between the external terminal and the reference terminal;
   a capacitor coupled between the semiconductor body and the external terminal; and
   a resistor coupled between the semiconductor body and the reference terminal.

13. A protection circuit as in claim 12, wherein the plurality of transistors further comprises:
   a first plurality of elongate and parallel doped regions formed at the face of the semiconductor body and coupled to the al terminal; and
   a second plurality of elongate doped regions formed parallel to the first plurality at the face of the semiconductor body, the second plurality formed alternately with the first plurality and spaced apart from the first plurality by the respective current path.

14. A protection circuit as in claim 13, wherein the first plurality comprises a collector, the second plurality comprises an emitter and the semiconductor body comprises a base.

15. A protection circuit as in claim 13, wherein the capacitor comprises a junction capacitor.

16. A protection circuit as in claim 13, wherein the first plurality comprises a drain, the second plurality comprises a source and the semiconductor body comprises a bulk of an MOS transistor.

17. A protection circuit as in claim 13, further comprising a third elongate doped region formed proximate the isolation region and coupled to the reference terminal, the third elongate doped region forming one of an anode and cathode of a diode, the isolation region forming another of the anode and cathode of the diode.

* * * * *